United States Patent
Shonai et al.

(10) Patent No.: US 6,920,684 B2
(45) Date of Patent: Jul. 26, 2005

(54) ASSEMBLING METHOD FOR PRODUCING A MAGNETIC SENSOR WITH HIGH OUTPUT ACCURACY

(75) Inventors: Yuichi Shonai, Miyagi-ken (JP); Ichiro Tokunaga, Miyagi-ken (JP); Seiji Kikuchi, Miyagi-ken (JP)

(73) Assignee: Alps Electric Co., Ltd., Tokyo (JP)

(*) Notice: Subject to any disclaimer, the term of this patent is extended or adjusted under 35 U.S.C. 154(b) by 284 days.

(21) Appl. No.: 10/223,891

(22) Filed: Aug. 19, 2002

(65) Prior Publication Data
US 2003/0041440 A1 Mar. 6, 2003

(30) Foreign Application Priority Data
Aug. 28, 2001 (JP) ........................... 2001-258048

(51) Int. Cl.[7] ............ G11B 5/127; H04R 31/00
(52) U.S. Cl. ............ 29/603.09; 29/417; 29/603.13; 29/603.14; 29/846; 29/850; 29/854; 216/22; 216/48; 360/316; 415/5; 415/41; 427/127; 427/128; 427/131
(58) Field of Search ................ 29/417, 603.07, 29/603.09, 603.13, 603.14, 846, 850, 854; 360/316; 216/22, 48; 415/5, 41; 427/127–131

(56) References Cited

U.S. PATENT DOCUMENTS

| 5,247,278 A | * | 9/1993 | Pant et al. ............ 338/32 R |
|---|---|---|---|
| 5,583,424 A | * | 12/1996 | Sato et al. ............ 323/282 |
| 5,805,390 A | * | 9/1998 | Takeura ............ 360/323 |
| 6,452,382 B1 | * | 9/2002 | Tokunaga et al. ....... 324/207.21 |

FOREIGN PATENT DOCUMENTS

| JP | 10302203 A | * 11/1998 | ............ G11B/5/02 |
|---|---|---|---|
| JP | 11-505966 | 5/1999 | |

OTHER PUBLICATIONS

"Index phase output characteristics of magnetic rotary encoder using a magneto–resistive element"; Kikuchi, Y.; Nakamura, F.; Wakiwaka, H.; Yamada, H.; Magnetics, IEEE Transactions on , vol. 33, Issue: 5 , Sep. 1997; pp. 3370–3372.*

* cited by examiner

*Primary Examiner*—Paul Kim
(74) *Attorney, Agent, or Firm*—Beyer Weaver & Thomas LLP (57) ABSTRACT

The fixed layers of all magnetoresistive elements that are formed on the same substrate are magnetized in the same direction. Chips including magnetoresistive elements are cut out individually from the substrate. A magnetic sensor is assembled by combining cut-out chips together with consideration given to the magnetization directions of the fixed layers of the magnetoresistive elements in the chips. In this manner, the fixed layers of the magnetoresistive elements are magnetized by a sufficiently strong magnetic field for magnetization, whereby an output signal having a large absolute value is obtained from the magnetoresistive elements.

2 Claims, 8 Drawing Sheets

FIG. 11B

ASSEMBLING METHOD FOR PRODUCING A MAGNETIC SENSOR WITH HIGH OUTPUT ACCURACY

BACKGROUND OF THE INVENTION

1. Field of the Invention

The present invention relates to an assembling method of a magnetic sensor using magnetoresistive elements that produce an output signal in accordance with magnetism sensed.

2. Description of the Related Art

Conventionally, magnetic sensors using magnetoresistive elements each of which produce an output signal in accordance with magnetism sensed have been developed. Each magnetoresistive element used in such magnetic sensors basically has a lamination structure that is composed of a free layer (free magnetic layer), a non-magnetic layer, a fixed layer (pinned magnetic layer), and an exchange bias layer (antiferromagnetic layer). A bias magnetic filed of the exchange bias layer acts on the fixed layer, whereby the fixed layer is magnetized in a particular direction by the exchange bias layer. On the other hand, the magnetization direction of the free layer is varied by an external magnetic field.

To fix (pin) the magnetization direction of the fixed layer of each magnetoresistive element, it is necessary to adjust the lattice magnetization of the exchange bias layer. To this end, a heat treatment is performed in which the exchange bias layer is cooled in a state that a magnetic field in a prescribed direction is applied to the exchange bias layer and it is heated to a temperature that is higher than or equal to a temperature called a blocking temperature where an exchange anisotropy magnetic field disappears.

In magnetic sensors using such magnetoresistive elements, magnetoresistive elements in which the magnetization directions of the fixed layers form 180° (they are in opposite directions) are connected to each other in series and a bridge circuit is formed by those magnetoresistive elements. In this case, since the magnetization directions of the fixed layers of the magnetoresistive elements that are connected to each other in series should form 180° (they should be in opposite directions), it is necessary to magnetize the fixed layers in directions that form 180° (i.e., in opposite directions).

Conventionally, the fixed layers of magnetoresistive elements are magnetized in the following manner. Conductors for current conduction are provided for magnetoresistive elements that are formed on a single substrate. Currents are caused to flow through the conductors and magnetic fields generated by the currents are applied to the magnetoresistive elements, whereby their fixed layers are magnetized. In this method, it is difficult to magnetize the fixed layers by sufficiently strong magnetic fields because the amounts of currents that flow through the conductors are restricted. As a result, a strong exchange anisotropy magnetic field cannot be obtained and the absolute value of an output signal of each magnetoresistive element cannot be made large. There is another problem that when a magnetic sensor is used in a variable resistor, there occur large deviations from a standard variation characteristic (i.e., a magnetic field variation vs. output variation characteristic). The reason for this problem would be that with a weak exchange anisotropy magnetic field it is difficult to magnetize each fixed layer in a predetermined direction.

Another method to replace the above conductor magnetization method has been developed in which the fixed layers of magnetoresistive elements are magnetized by applying an external magnetic field to the magnetoresistive elements. With this method, magnetization can be effected by a strong external magnetic field. However, since magnetoresistive elements adjacent to each other should be magnetized in directions that form 180° (i.e., in opposite directions), an external field that is applied to one magnetoresistive element affects the other magnetoresistive element; a strong limitation is imposed on the strength of the magnetic field for magnetization. As a result, it is difficult to magnetize the fixed layers of magnetoresistive elements by a sufficiently strong magnetic field. Therefore, the absolute value of an output signal of each magnetoresistive element cannot be made large. For the same reason as described above, there occur large deviations from a standard variation characteristic when a magnetic sensor is used in a variable resistor.

In the above-described conventional example, the fixed layer is generally made of $\alpha\text{-Fe}_2\text{O}_3$ and the strength of the magnetic field is about 200 kA/m. Nowadays, it is required to increase the exchange anisotropy magnetic field by using PtMn or the like for the fixed layer and magnetizing it at about 600 kA/m. However, where a bridge circuit is formed by the conventional external magnetic field magnetization method, as described above, an external field that is applied to one magnetoresistive element affects the other magnetoresistive element, the strength of the magnetic field for magnetization is restricted to about 200 kA/m; it is substantially impossible to increase it to the required level of 600 kA/m. Therefore, the current situation is such that the absolute value of an output signal of each magnetoresistive element cannot be made large or there occur large deviations from a standard variation characteristic when a magnetic sensor is used in a variable resistor.

SUMMARY OF THE INVENTION

An object of the present invention is to provide an assembling method of a magnetic sensor in which the fixed layers of respective magnetoresistive elements are magnetized by a sufficiently strong magnetic field, whereby the magnetoresistive elements produce an output signal having a large absolute value or the magnetic sensor has high output accuracy when used in a variable resistor.

The basic concept of the invention is as follows. The fixed layers of all magnetoresistive elements that are formed on the same substrate are magnetized in the same direction. Chips including magnetoresistive elements are cut out individually from the substrate. A magnetic sensor is assembled by combining cut-out chips together with consideration given to the magnetization directions of the fixed layers of the magnetoresistive elements in the chips. In this manner, the fixed layers of the magnetoresistive elements are magnetized by a sufficiently strong magnetic field for magnetization, whereby an output signal having a large absolute value is obtained from the magnetoresistive elements.

An assembling method of a magnetic sensor according to the invention, which is based on the above basic concept, is characterized by comprising the steps of forming a plurality of magnetoresistive elements on the same substrate in such a manner that they are arranged regularly; forming a plurality of connection pads on the same substrate at regular positions in vertical and horizontal directions in such a manner that they are connected to terminals of the magnetoresistive elements; magnetizing, in the same magnetization direction, fixed layers of all the magnetoresistive elements that are formed on the same substrate; cutting out a plurality of chips each having a set of magnetoresistive elements and connection pads from the substrate; and combining a plurality of cut-out chips together with consideration given to the magnetization directions of the fixed layers of the magnetoresistive elements in the chips.

Chips are cut out individually from the substrate in such a manner that each chip includes one magnetoresistive element and one set of connection pads. Alternatively, chips are cut out in such a manner that each chip includes at least two magnetoresistive elements and two sets of connection pads. It is desirable that connection pads be formed at symmetrical positions with respect to two sizes that form a corner of each chip and be connected to each other by wire bonding.

A magnetic sensor is assembled in the following manner by combining a plurality of chips together. A bridge circuit that produces a single-phase output signal can be formed by using four chips in each of which one magnetoresistive element is formed, by combining the four chips together in such a manner that the magnetization directions of the fixed layers of the magnetoresistive elements belonging to chips adjacent to each other deviate from each other by 90° in order in the same rotational direction and connecting, in series, magnetoresistive elements whose fixed layers are magnetized in opposite directions.

Instead of a bridge circuit, a voltage dividing circuit can be formed by using two chips in each of which one magnetoresistive element is formed, by combining the two chips together in such a manner that the magnetization directions of the fixed layers of the magnetoresistive elements are different from each other by 180° and connecting the magnetoresistive elements to each other in series.

Bridge circuits that produce a multiple-phase output signal can be formed by using four chips in each of which at least two magnetoresistive elements are formed rather than four chips in each of which one magnetoresistive element is formed, by combining the four chips together in such a manner that the magnetization directions of the fixed layers of the magnetoresistive elements belonging to chips adjacent to each other deviate from each other by 90° in order in the same rotational direction and connecting, in series, magnetoresistive elements whose fixed layers are magnetized in opposite directions.

Where chips in each of which at least two magnetoresistive elements are formed are combined together, voltage dividing circuits may be formed by using two such chips by combining the two chips together in such a manner that the magnetization directions of the fixed layers of the magnetoresistive elements belong to one chip are different from those of the magnetoresistive elements belong to the other chip by 180° and connecting, in series, magnetoresistive elements whose fixed layers are magnetized in opposite directions.

DESCRIPTION OF THE PREFERRED EMBODIMENTS

Embodiments of the present invention will be hereinafter described with reference to the accompanying drawings.

Figure 7:
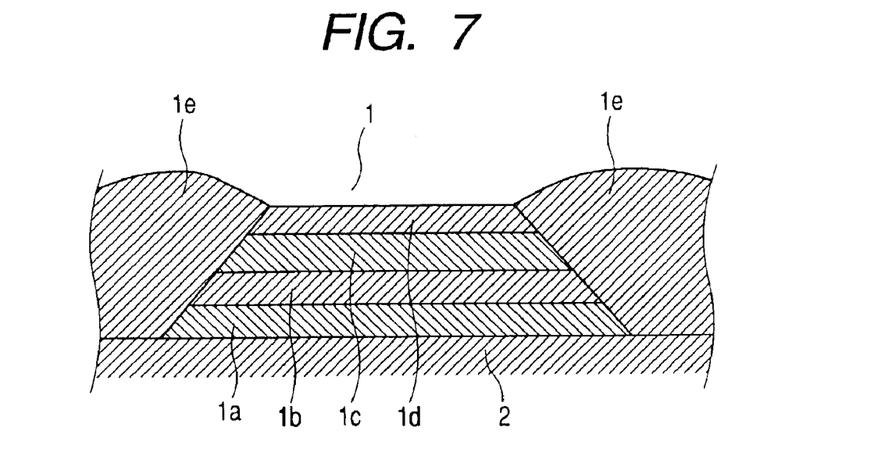
FIG. 7 is a sectional view of a magnetoresistive element.

As shown in FIG. 7, a magnetoresistive element 1 that produces an output signal in accordance with magnetism sensed has a basic configuration in which an exchange bias layer (antiferromagnetic layer) $1a$, a fixed layer (pinned magnetic layer) $1b$, a non-magnetic layer $1c$, and a free layer (free magnetic layer) $1d$ are laminated on a substrate 2, and is a kind of GMR (giant magnetoresistive) element that utilizes the giant magnetoresistance effect.

For the magnetoresistive element 1 to exhibit a giant magnetoresistance effect, a Pt—Mn layer, an NiFe layer, a Cu layer, and an NiFe layer, for example, are employed as the exchange bias layer $1a$, the fixed layer $1b$, the non-magnetic layer $1c$, and the free layer $1d$, respectively. However, the invention is not limited to such a case and any materials can be employed as long as they allow the magnetoresistive element 1 to exhibit a giant magnetoresistance effect. Further, the structure of the magnetoresistive element 1 is not limited to the above lamination structure as long as it exhibits a giant magnetoresistance effect. It is preferable that the exchange bias layer $1a$ be made of only X-Mn or an alloy containing it (X is one or more elements selected from Pt, Pd, Ir, Rh, Ru, and Os).

The fixed layer $1b$ of the magnetoresistive element 1 shown in FIG. 7 is magnetized by the exchange bias layer $1a$ and its magnetization direction is fixed (pinned) in a particular direction by the exchange bias layer $1a$. The magnetization direction of the free layer $1d$ with respect to that of the fixed layer $1b$ is varied by an external magnetic field. Terminal layers $1e$ are formed on both sides of the magnetoresistive element 1. A variation in the resistance between the two terminal layers $1e$ is output as an output signal, the variation depending on the direction of magnetization, caused by an external magnetic field, of the free layer $1d$ with respect to the fixed magnetization direction of the fixed layer $1b$.

Figure 6A:
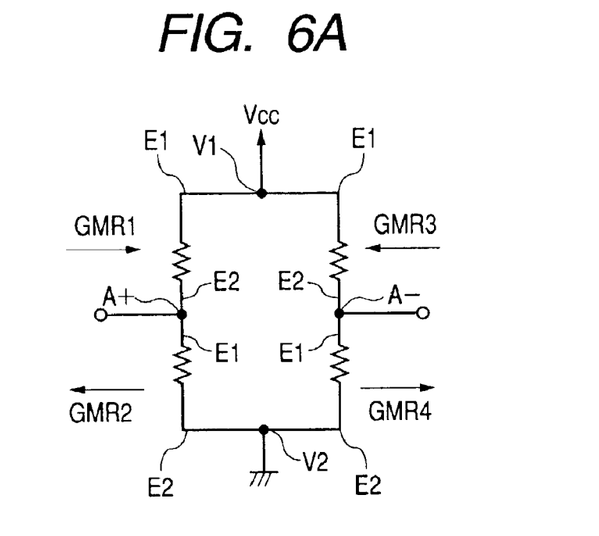
FIG. 6A is a circuit diagram of the bridge circuit of FIG. 4A.

A bridge circuit shown in FIG. 6A by combining four magnetoresistive elements 1 shown in FIG. 7. The magnetoresistive elements shown in FIG. 6A are denoted by respective symbols GMR1, GMR2, GMR3, and GMR4. One of the terminal layers that are formed on both sides of each magnetoresistive element is denoted by E1 and the other terminal layer is denoted by E2.

Among the four magnetoresistive elements GMR1, GMR2, GMR3, and GMR4, the two magnetoresistive elements GMR1 and GMR2 whose fixed layers 1b are different from each other in magnetization direction by 180° and the two magnetoresistive elements GMR3 and GMR4 whose fixed layers 1b are also different from each other in magnetization direction by 180° are used in pairs. Further, the fixed layers 1b of the magnetoresistive elements GMR1 and GMR3 that are located adjacent to each other are different from each other in magnetization direction by 180°, and the fixed layers 1b of the magnetoresistive elements GMR2 and GMR4 that are located adjacent to each other are also different from each other in magnetization direction by 180°.

As shown in FIG. 6A, the magnetization direction of the fixed layer 1b of the magnetoresistive element GMR1 is set in a direction indicated by a rightward arrow and that of the fixed layer 1b of the magnetoresistive element GMR2 is set in the opposite direction (that forms 180° with the former direction), that is, in a direction indicated by a leftward arrow. The magnetization direction of the fixed layer 1b of the magnetoresistive element GMR3 is set in a direction indicated by a leftward arrow and that of the fixed layer 1b of the magnetoresistive element GMR4 is set in the opposite direction (that forms 180° with the former direction), that is, in a direction indicated by a rightward arrow.

Further, with regard to the two magnetoresistive elements GMR1 and GMR3 that are located adjacent to each other, the magnetization direction of the fixed layer 1b of the magnetoresistive element GMR1 is set in the direction indicated by the rightward arrow and that of the fixed layer 1b of the magnetoresistive element GMR3 is set in the opposite direction (that forms 180° with the former direction), that is, in the direction indicated by the leftward arrow. With regard to the two magnetoresistive elements GMR2 and GMR4 that are located adjacent to each other, the magnetization direction of the fixed layer 1b of the magnetoresistive element GMR2 is set in the direction indicated by the leftward arrow and that of the fixed layer 1b of the magnetoresistive element GMR4 is set in the opposite direction (that forms 180° with the former direction), that is, in the direction indicated by the rightward arrow.

In this case, since no external field acts on the free layers 1d of the four magnetoresistive elements GMR1, GMR2, GMR3, and GMR4, the magnetization directions of the free layers 1d are in indefinite directions.

Further, the terminal layer E1 of the magnetoresistive element GMR2 is connected to the terminal layer E2 of the magnetoresistive element GMR1, whereby the two magnetoresistive elements GMR1 and GMR2 (first pair) are connected to each other in series. And the terminal layer E1 of the magnetoresistive element GMR4 is connected to the terminal layer E2 of the magnetoresistive element GMR3, whereby the two magnetoresistive elements GMR3 and GMR4 (second pair) are connected to each other in series.

The terminal layers E1 of the magnetoresistive elements GMR1 and GMR3 are connected to each other and the plus side of a voltage source Vcc is connected to their connecting point V1. The terminal layers E2 of the magnetoresistive elements GMR2 and GMR4 are connected to each other and the ground side of the voltage source Vcc is connected to their connecting point V2. An input voltage is applied between the connecting points V1 and V2.

The connecting point A+ of the terminal layer E2 of the magnetoresistive element GMR1 and the terminal layer E1 of the magnetoresistive element GMR2 serves as an output terminal for output of a resistance variation signal of the magnetoresistive elements. The connecting point A− of the terminal layer E2 of the magnetoresistive element GMR3 and the terminal layer E1 of the magnetoresistive element GMR4 serves as an output terminal for output of a resistance variation signal of the magnetoresistive elements. Resistance variation signals of the magnetoresistive elements are output from the two connecting points A+ and A−.

When the magnetization directions of the free layers 1d of the four magnetoresistive elements GMR1, GMR2, GMR3, and GMR4 that form the bridge circuit are varied uniformly by an external magnetic field with respect to the magnetization directions of their fixed layers 1b, resistance variations occur in the four magnetoresistive elements GMR1, GMR2, GMR3, and GMR4 in accordance with how the magnetization directions of the free layers 1d vary. The resistance variation is minimum when the magnetization direction of the free layer 1d of a magnetoresistive element is the same as that of its fixed layer 1b, and is maximum when the former is parallel with and opposite to the latter (180° is formed). Therefore, sinusoidal output signals S1', and S2' shown in FIG. 4C are output from the two connecting points A+ and A− that are output terminals of the bridge circuit in accordance with the direction of an external magnetic field that magnetizes the free layers 1d of the magnetoresistive elements GMR1, GMR2, GMR3, and GMR4. An output voltage between the connecting points A+ and A− is obtained as an output signal S1 shown in FIG. 4D.

If the center of a resistance variation of a magnetoresistive element is employed as a reference point, the resistances of the magnetoresistive elements GMR1 and GMR4 or the magnetoresistive elements GMR2 and GMR3 whose fixed layers 1b are magnetized in the same direction vary in the same polarity (the polarity is set "+" and "−" in a resistance increasing direction and decreasing direction, respectively) and the resistances of the magnetoresistive elements GMR1 and GMR2 or the magnetoresistive elements GMR3 and GMR4 whose fixed layers 1b are magnetized parallel with each other in opposite directions (180° is formed) vary in opposite polarities. Therefore, a Wheatstone bridge circuit is formed based on the connection relationship among the four magnetoresistive elements GMR1, GMR2, GMR3, and GMR4 shown in FIG. 6A and their manners of resistance variation. By causing the magnetoresistive elements GMR1, GMR2, GMR3, and GMR4 to sense an external magnetic field, they function as a magnetic sensor that performs a desired operation according to their resistance variation characteristics.

The four magnetoresistive elements that form a conventional bridge circuit are formed on a single substrate (wafer) as described in the "Description of the Related Art" section, and the fixed layers of the four magnetoresistive elements that are formed on the same substrate are magnetized in directions that are difference from each other by 90° (or 180°). This restricts the strength of a magnetization magnetic field for fixing the magnetization directions of the fixed layers of the magnetoresistive elements to about 200 kA/m at most.

The invention makes it possible to perform magnetization and fixing by increasing the strength of a magnetization magnetic field for fixing the magnetization directions of the fixed layers of magnetoresistive elements to about 600 kA/m. The basic concept for that purpose is as follows. The fixed layers of all magnetoresistive elements that are formed on the same substrate are magnetized in the same direction, chips including the magnetoresistive elements are cut out of the substrate, and a magnetic sensor is assembled by combining cut-out chips together with consideration given to the magnetization directions of the fixed layers of the magnetoresistive elements in the chips. In this manner, the fixed layers of the magnetoresistive elements can be magnetized by a sufficiently strong magnetic field for magnetization and hence an output signal having a large absolute value can be produced by the magnetoresistive elements. Specific embodiments will be described below.

Figure 1:
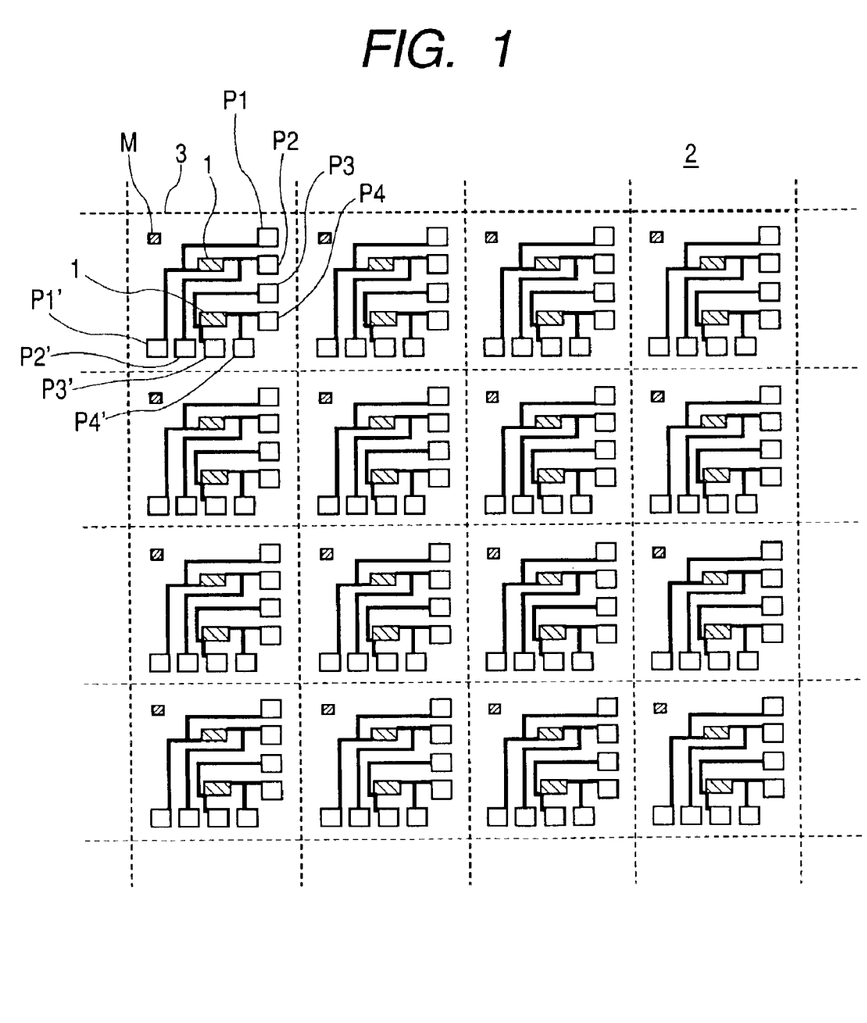
FIG. 1 is a plan view showing a case that magnetoresistive elements are formed on a substrate according to the present invention.

In FIG. 1, rectangular portions enclosed by vertical and horizontal chain lines that are drawn on a single substrate 2 indicate chips 3 to be cut out individually from the substrate 2. In the example of FIG. 1, two magnetoresistive elements (1,1) are formed in each chip 3.

Magnetoresistive elements 1 are formed on the same substrate 2 so as to be arranged in the vertical and horizontal directions in such a manner that two magnetoresistive elements 1 are included in each of chips 3 that are enclosed by vertical and horizontal chain lines in FIG. 1. In forming magnetoresistive elements 1 on the same substrate 2, the magnetoresistive elements 1 are cooled in a state that an external magnetic field is applied to the magnetoresistive elements 1 at a temperature that is higher than or equal to a blocking temperature, whereby the fixed layers of the magnetoresistive elements 1 are magnetized in one direction. In the example of FIG. 1, the fixed layers of the magnetoresistive elements 1 are magnetized upward (i.e., in the vertical direction in FIG. 1).

Further, connection pads P1, P2, P3, and P4 that correspond to the respective connecting points A+, V1, A−, and V2 shown in FIG. 6A are formed at regular intervals along one side 3a of two sides that form a corner of each rectangular chip 3. Connection pads P1', P2', P3', and P4' that are paired with the respective connection pads P1, P2, P3, and P4 and correspond to the respective connecting points A+, V1, A−, and V2 shown in FIG. 6A are also formed at regular intervals along the other side 3b of the two sides that form the corner of each rectangular chip 3. The sets of connection pads P1, P2, P3, and P4 and the sets of connection pads P1', P2', P3', and P4' are formed on the same substrate 2 so as to be arranged in the vertical and horizontal directions.

Figure 2:
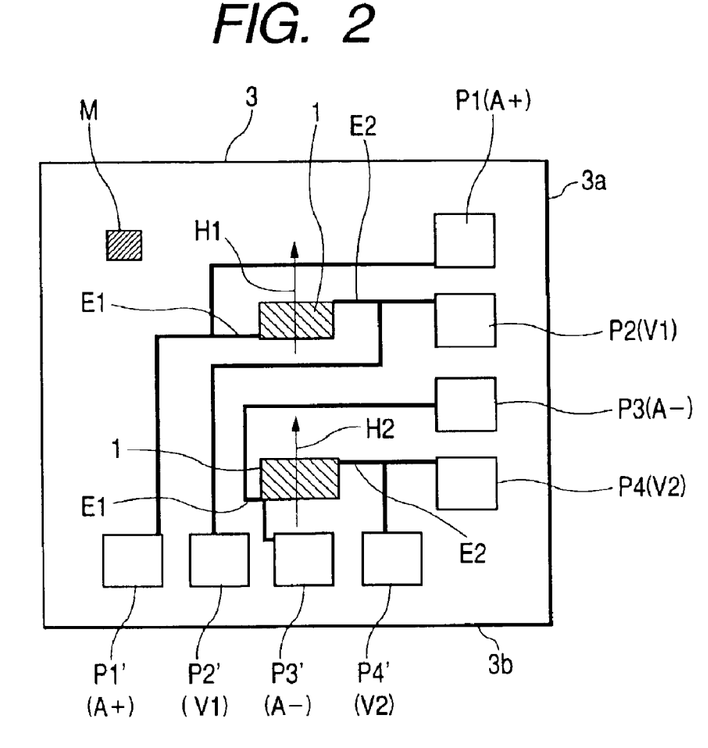
FIG. 2 is a plan view showing a case that two magnetoresistive elements are formed in a single chip.

In this case, as shown in FIG. 2 in an enlarged manner, the connection pads P1, P2, P3, and P4 and the connection pads P1', P2', P3', and P4' that are paired with each other may be formed at symmetrical positions with respect to the two sides 3a and 3b that form the corner of each chip 3. The connection pads P1, P2, P3, and P4 and the connection pads P1', P2', P3', and P4' that are paired with each other are arranged regularly along the sides 3a and 3b of the corner of each of the chips 3 as sections of the single substrate 2 and are formed in each chip 3 where two magnetoresistive elements 1 are formed.

As shown in FIGS. 1 and 2, the terminal E1 of one magnetoresistive element 1 that is formed in each chip 3 is connected to the connection pads P1 and P1' by wiring patterns and its terminal E2 is connected to the connection pads P2 and P2' by wiring patterns.

The terminal E1 of the other magnetoresistive element 1 that is formed in each chip 3 is connected to the connection pads P3 and P3' by wiring patterns and its terminal E2 is connected to the connection pads P4 and P4' by wiring patterns.

Although in FIG. 1 the 16 chips 3, in each of which the two magnetoresistive elements 1 are formed, are formed on the substrate 2, the number of chips 3 to be formed on a single substrate 2 is not limited to 16. Although in FIG. 1 the chips 3 are arranged at regular intervals in the vertical and horizontal directions, the manner of arrangement of the chips 3 is not limited to such an arrangement; the chips 3 may be arranged irregularly in the vertical and horizontal directions or they may be aligned in the vertical or horizontal direction.

In forming two magnetoresistive elements 1 in a chip 3, a marking M indicating magnetization directions of the fixed layers of the magnetoresistive elements 1 is formed on the same chip 3. In the example of FIG. 1, the markings M are formed regularly in such a manner that each marking M is located close to the top-left corner of each chip 3 at an intersecting point of a line extended from the connection pad P1 in the horizontal direction and a line extended from the connection pad P1' in the vertical direction.

Then, the chips 3 each having a set of two magnetoresistive elements 1 and eight connection pads P1, P2, P3, P4, P1', P2', P3', and P4' are cut out individually from the substrate 2 along the vertical and horizontal chain lines in FIG. 1. FIG. 2 is an enlarged view of each cut-out chip 3.

Figure 4A:
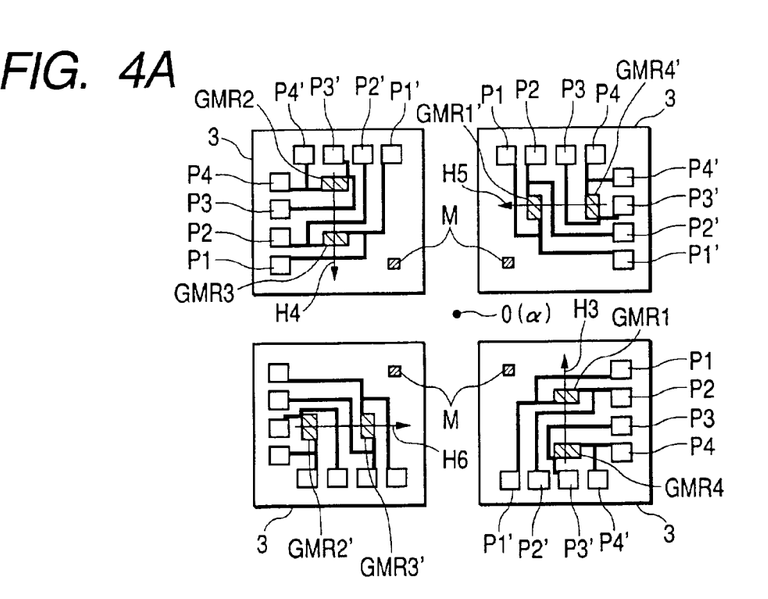
FIG. 4A is a plan view showing a case that a bridge circuit is formed by combining four chips together.

Then, as shown in FIG. 4A, four cut-out chips 3 are combined together with consideration given to the magnetization directions of the fixed layers of the magnetoresistive elements 1 in the chips 3. In the example of FIG. 4A, the four chips 3 are combined together in such a manner that the magnetization directions of the fixed layers of the magnetoresistive elements 1 deviate from each other by 90° in order in the same rotational direction. Although FIG. 4A is drawn as if spaces existed between the chips 3, actually the chips 3 are assembled so as to contact each other without forming gaps so that the magnetoresistive elements 1 come adjacent to each other. This assembling method makes it possible to uniformize the magnetic sensitivities of the four magnetoresistive elements 1 to an external magnetic field and to thereby produce a correct output signal.

In this embodiment, since the fixed layers of the magnetoresistive elements 1 formed on the same substrate 2 are magnetized in the same direction, no problems occur even if magnetic fields for magnetization that are applied to magnetoresistive elements 1 adjacent to each other influence each other. The strength of the magnetic field for magnetizing the fixed layers of the magnetoresistive elements 1 can be increased to 600 kA/m; the fixed layers of the magnetoresistive elements 1 can be magnetized by such an increased magnetic field for magnetization and resulting magnetization can be fixed. Therefore, the magnetic sensitivities of the magnetoresistive elements 1 are increased, whereby the absolute value of their output signal can be increased and correct magnetic field detection is enabled. Further, the output accuracy can be increased. The chips 3 have a rectangular shape, and the magnetization directions of the fixed layers of the magnetoresistive elements 1 and the positions of the connection pads P1, P2, P3, P4, P1', P2', P3', and P4' are parallel with or are aligned in the vertical or horizontal direction on the same substrate 2. Therefore, when four chips 3 are combined in such a manner that the magnetization directions of the fixed layers of the magnetoresistive elements 1 deviate from each other by 900 in order in the same rotational direction, the chips 3 can be arranged without forming gaps and hence the accuracy of assembling can be increased.

To clarify a relationship between the magnetoresistive elements shown in FIG. 4A and the magnetoresistive elements of the bridge circuit shown in FIG. 6A, a description will be made with a notation that in FIG. 4A magnetoresistive elements for producing a first-phase output signal S1 (see FIG. 4D) are denoted by symbols GMR1, GMR2, GMR3, and GMR4 and magnetoresistive elements for producing a second-phase output signal S2 (see FIG. 4D) are denoted by symbols GMR1', GMR2', GMR3', and GMR4'. The signals S1 and S2 shown in FIG. 4D have a phase difference of 90° because the magnetization directions of the four magnetoresistive elements deviate from each other by 90°.

In the example of FIG. 4A, the magnetization direction H3 of the fixed layers of the magnetoresistive elements GMR1 and GMR4 are set upward and the magnetization direction H4 of the fixed layers of the magnetoresistive elements GMR2 and GMR3 are set downward, that is, set parallel with and opposite to the magnetization direction H3 (180° is formed). Further, to produce the two-phase output signals S1 and S2, the four magnetoresistive elements GMR1', GMR2', GMR3', and GMR4' are provided in addition to the above four magnetoresistive elements GMR1, GMR2, GMR3, and GMR4. The magnetization direction H5 of the fixed layers of the magnetoresistive elements GMR1' and GMR4' are set leftward and the magnetization direction H6 of the fixed layers of the magnetoresistive elements GMR2' and GMR3' are set rightward, that is, set parallel with and opposite to the magnetization direction H5 (180° is formed).

First, a configuration of a bridge circuit for producing the first-phase output signal (sinusoidal waveform) S1 shown in FIG. 4D will be described. The connection pad P1 of the magnetoresistive element GMR1 and the connection pad P3 of the magnetoresistive element GMR2 are connected to each other by wire bonding, whereby the two magnetoresistive elements GMR1 and GMR2 are connected to each other in series. The connection pad P2 of the magnetoresistive element GMR3 and the connection pad P3 of the magnetoresistive element GMR4 are connected to each other by wire bonding, whereby the two magnetoresistive elements GMR3 and GMR4 are connected to each other in series.

Then, the connection pad P2 of the magnetoresistive element GMR1 and the connection pad P2 of the magnetoresistive element GMR3 are connected to each other by wire bonding, and the plus side of a voltage source Vcc is connected to their connecting point V1. The connection pad P4 of the magnetoresistive element GMR2 and the connection pad P4 of the magnetoresistive element GMR4 are connected to each other by wire bonding, and the ground side of the voltage source Vcc is connected to their connecting point V2. The two connecting points V1 and V2 are used as terminals for applying a supply voltage. Then, the circuit shown in FIG. 6A is formed.

Further, the connection pad P1 of the magnetoresistive element GMR1 and the connection pad P3' of the magnetoresistive element GMR2 are connected to each other by wire bonding, and their connecting point A+ is employed as an output terminal for output of a resistance variation of the magnetoresistive elements. The connection pad P1' of the magnetoresistive element GMR3 and the connection pad P3' of the magnetoresistive element GMR4 are connected to each other by wire bonding, and their connecting point A− is employed as an output terminal for output of a resistance variation of the magnetoresistive elements. The two connecting points A+ and A− are used as terminals for outputting a resistance variation signal of the magnetoresistive elements.

Next, a configuration of a bridge circuit for producing the second-phase output signal (sinusoidal waveform) S2 shown in FIG. 4D will be described. The connection pad P1 of the magnetoresistive element GMR1' and the connection pad P3 of the magnetoresistive element GMR2' are connected to each other by wire bonding, whereby the two magnetoresistive elements GMR1' and GMR2' are connected to each other in series. The connection pad P2 of the magnetoresistive element GMR3' and the connection pad P3 of the magnetoresistive element GMR4' are connected to each other by wire bonding, whereby the two magnetoresistive elements GMR3' and GMR4' are connected to each other in series.

Then, the connection pad P2 of the magnetoresistive element GMR1' and the connection pad P2 of the magnetoresistive element GMR3' are connected to each other by wire bonding, and the plus side of the voltage source Vcc is connected to their connecting point V1. The connection pad P4 of the magnetoresistive element GMR2' and the connection pad P4 of the magnetoresistive element GMR4' are connected to each other by wire bonding, and the ground side of the voltage source Vcc is connected to their connecting point V2. The two connecting points V1 and V2 are used as terminals for applying a supply voltage. Then, a circuit similar to the circuit shown in FIG. 6A is formed.

Further, the connection pad P1' of the magnetoresistive element GMR1' and the connection pad P3' of the magnetoresistive element GMR2' are connected to each other by wire bonding, and their connecting point A+ is employed as an output terminal for output of a resistance variation of the magnetoresistive elements. The connection pad P1' of the magnetoresistive element GMR3' and the connection pad P3' of the magnetoresistive element GMR4' are connected to each other by wire bonding, and their connecting point A− is employed as an output terminal for output of a resistance variation of the magnetoresistive elements. The two connecting points A+ and A− are used as terminals for outputting a resistance variation signal of the magnetoresistive elements. The above-mentioned connection pads are formed at symmetrical positions with respect to two sides that form a corner of each rectangular chip. Therefore, wire bonding operations on the connection pads can be performed automatically by inputting position data of the connection pads to an existing wire bonding apparatus. This facilitates the assembling of the chips 3.

Figure 4B:
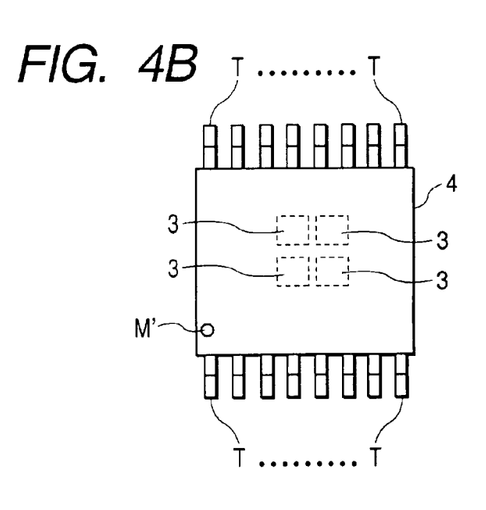
FIG. 4B is a plan view showing a case that the bridge circuit of FIG. 4A is implemented as an IC chip.
Figure 4C:
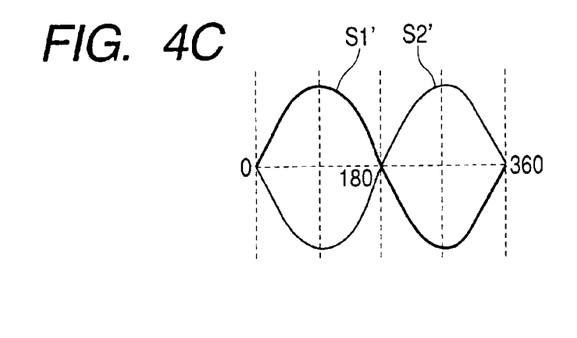
FIGS. 4C and 4D are characteristic diagrams showing two-phase output signals.
Figure 4D:
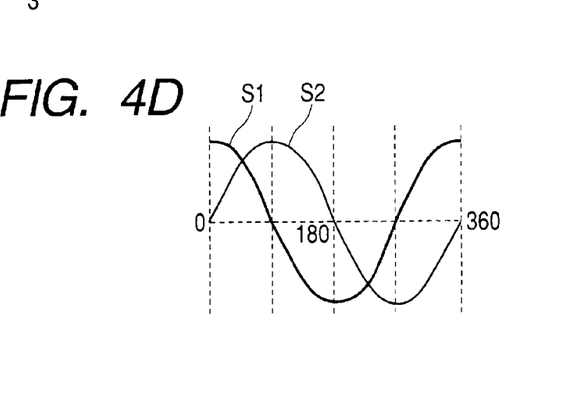

The four magnetoresistive elements GMR1, GMR2, GMR3, and GMR4 that constitute the first bridge circuit that produces the first-phase output signal S1 shown in FIG. 4D are arranged in such a manner that their magnetization directions deviate from each other by 90° in order in the same rotation direction. The same is true of the four magnetoresistive elements GMR1', GMR2', GMR3', and GMR4' that constitute the second bridge circuit that produces the second-phase output signal S2 shown in FIG. 4D.

When an external magnetic field acts on the free layers of the above magnetoresistive elements and the magnetization directions of the free layers are thereby rotated with respect to the fixed magnetization directions of the fixed layers, resistance variations occur in accordance with amounts of rotation of the magnetization directions of the free layers. The resistance variation is minimum when the magnetization direction of the free layer of a magnetoresistive element is the same as that of its fixed layer, and is maximum when the former is parallel with and opposite to the latter (180° is formed). Therefore, sinusoidal 2-phase output signals S1 and S2 shown in FIG. 4C that deviate from each other by 90° in phase are output from the two connecting points A+ and A− of the first bridge circuit and those of the second bridge circuit, respectively, in accordance with the direction of an external magnetic field.

If the center of a resistance variation of a magnetoresistive element is employed as a reference point, the resistances of the magnetoresistive elements GMR1 and GMR4, GMR1' and GMR4', GMR2 and GMR3, or GMR2' and GMR3' whose fixed layers are magnetized in the same direction vary in the same polarity (the polarity is set "+" and "−" in a resistance increasing direction and decreasing direction, respectively). The resistances of the magnetoresistive elements GMR1 and GMR2, GMR1' and GMR2', GMR3 and GMR4, or GMR3' and GMR4' whose fixed layers are magnetized parallel with each other in opposite directions (180° is formed) vary in opposite polarities.

Therefore, two Wheatstone bridge circuits is formed based on the connection relationships among the magnetoresistive elements GMR1, GMR2, GMR3, GMR4 and the magnetoresistive elements GMR1', GMR2', GMR3', GMR4', shown in FIG. 4A and their manners of resistance variation. By causing the magnetoresistive elements GMR1, GMR2, GMR3, GMR4, GMR1', GMR2', GMR3', GMR4' to sense an external magnetic field, they function as a magnetic sensor.

As shown in FIG. 4B, four chips 3 are mounted on a lead frame (not shown) and common connection pads of the magnetoresistive elements formed on the four chips 3 are connected to 16 terminals T of the lead frame by wire bonding. Then, the four chips 3 are hermetically sealed with a sealing resin 4. In this manner, an IC chip 87 is constructed. In this case, it is desirable that the sealing resin 4 be given a marking M' at a position corresponding to a terminal T as the origin of the magnetoresistive elements in the chips 3 that are combined together in such a manner that the magnetization directions of the fixed layers of the magnetoresistive elements deviate from each other by 90° in order in the same rotational direction.

Whereas in FIG. 4A the four chips 3 each having two magnetoresistive elements are combined together, it is possible to produce output signals (sinusoidal waveforms) of N/2 phases (N=2, 4, 6, 8, . . . , 2n) by combining N chips 3 each having two magnetoresistive elements in such a manner that the magnetization directions of the fixed layers deviate from each other by a prescribed angle and arranging the chips on a circle.

Figure 9:
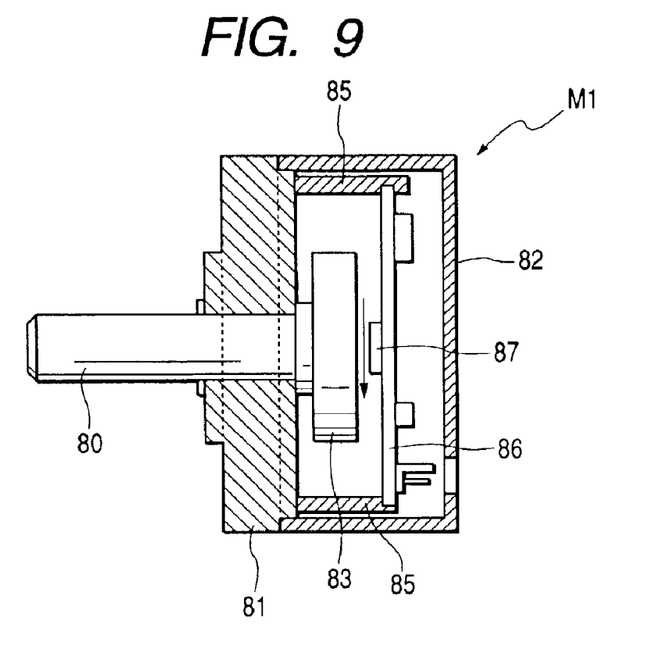
FIG. 9 is a sectional view of a variable resistor that is formed by using a magnetic sensor according to the invention.
Figure 10:
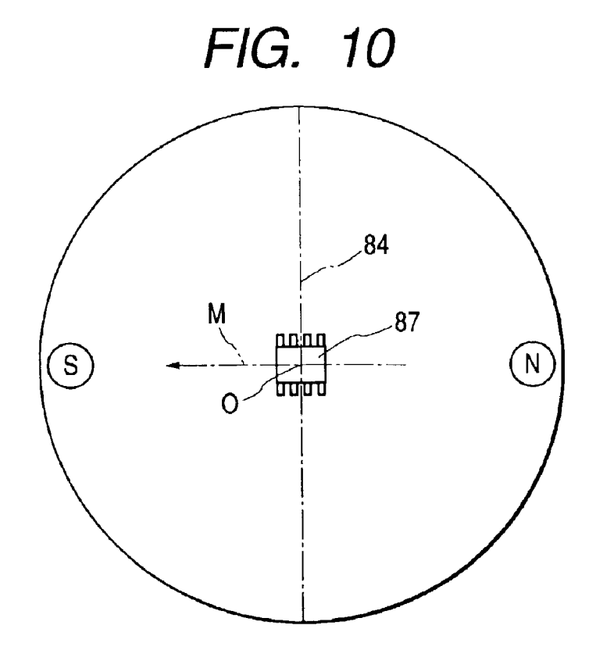
FIG. 10 shows the main part of the variable resistor of FIG. 9.

FIGS. 9 and 10 show an example in which a variable resistor is constructed by using the above-described magnetic sensor. A potentiometer M1 shown in FIG. 9 has a rotary shaft 80, a bearing member 81 that supports the rotary shaft 80 in such a manner that the rotary shaft 80 can rotate about its axis, a cap-shaped cover member 82 that is attached to the back surface of the bearing member 81, a magnetic coding member 83 that is covered with the cover member 82 and provided on the back side of the bearing member 81 so as to be integral with the rotary shaft 80, an attachment board 86 that is mounted with circuit parts such as the above-described IC chip 87 and a connector for outputting signals to the outside, and a holder member 85 by which the attachment board 86 is attached to the bearing member 81.

For example, the bearing member 81 is formed by cutting a brass material and the cover member 82 is formed by drawing a metal plate. The rotary shaft 80 has a rod-like shape and is made of a non-magnetic material such as a resin or a non-magnetic stainless steel. One end portion of the rotary shaft 80 penetrates through the bearing member 81 and projects to its back side, and the disc-shaped magnetic coding member 83 is attached to the one end portion of the rotary shaft 80 so as to be perpendicular to the latter. The magnetic coding member 83 is a magnet plate that is magnetized in such a manner that a portion on one side (left side in FIG. 10) of a neutral line 84 passing through a central magnetism point 0 on one surface of the magnetic coding member 83 serves as an S pole and a portion on the other side (right side in FIG. 10) serves as an N pole.

The rotary shaft 80 may be made of a soft magnetic material of iron. Alternatively, the rotary shaft 80 may be made of a ferromagnetic material if it is sufficiently distant from the magnetic coding member 83 and the IC chip 87. The IC chip 87 and the magnetic coding member 83 are disposed parallel with each other with a gap interposed in between. The distance (gap) between the magnetic coding member 83 and the board 86 is set such a value (usually, several millimeters to a little greater than 10 mm) that the giant magnetoresistive elements can be used in such a range as to be saturated by a magnetic field generated by the magnetic coding member 83. The rotation center O of the rotary shaft 80 is set coincident with the center of the four chips that is denoted by symbol α in FIG. 4A. The IC chip 87 is sufficiently smaller than the magnet. As shown in FIG. 10, since the magnet is of two poles, a parallel magnetic field M extending in one direction acts on the IC chip 87. The magnetization direction rotates so as to follow the direction of the magnetic field M as the rotary shaft 80 rotates. Operating in the above-described manner, the variable resistor produces sinusoidal signals that deviate from each other by 90° in phase as shown in FIG. 4D.

Figure 6B:
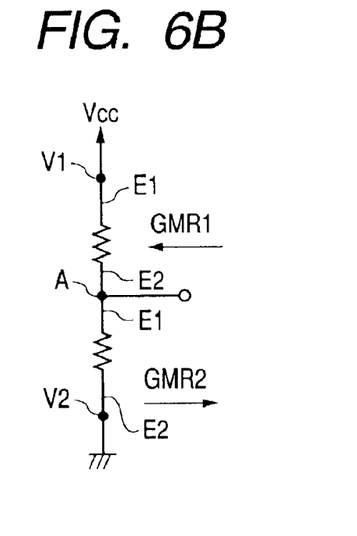
FIG. 6B is a circuit diagram of the voltage dividing circuit of FIG. 5A.

Although in the example of FIGS. 4A and 6A the bridge circuit is formed by using four magnetoresistive elements, a voltage dividing circuit may be formed by using two magnetoresistive elements GMR1 and GMR2 as shown in FIG. 6B. In the voltage dividing circuit shown in FIG. 6B, the two magnetoresistive elements GMR1 and GMR2 are connected to each other in series. The plus side of a voltage source Vcc is connected to a terminal E1 of the magnetoresistive element GMR1 (connecting point V1), and the ground side of the voltage source Vcc is connected to a terminal E2 of the magnetoresistive element GMR2 (connecting point V2). A terminal E2 of the magnetoresistive element GMR1 and a terminal E1 of the magnetoresistive element GMR2 are connected to each other and their connecting point A is employed as an output terminal. In this case, the fixed layers of the two magnetoresistive elements GMR1 and GMR2 are magnetized parallel with each other in opposite directions (180° is formed).

A voltage is applied between the connecting points V1 and V2 of the two series-connected magnetoresistive elements GMR1 and GMR2, and a division voltage that varies in accordance with resistance variations of the two magnetoresistive elements GMR1 and GMR2 is output from the connecting point A. The magnetic sensor senses an external magnetic field based on a variation in the output value.

Figure 3:
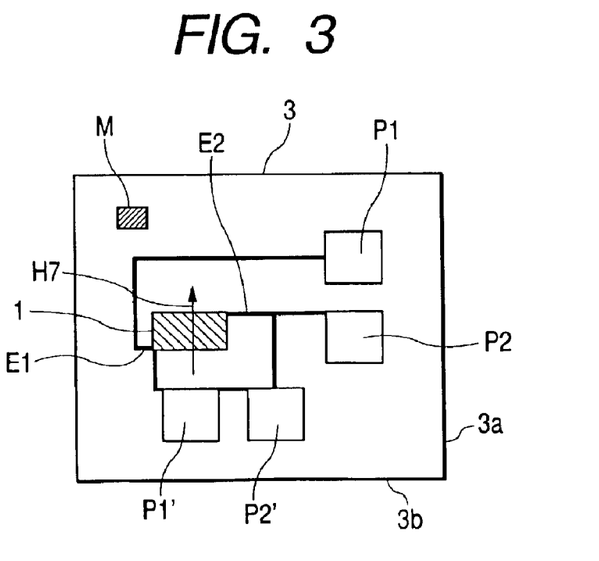
FIG. 3 is a plan view showing a case that a single magnetoresistive element is formed in a single chip.
Figure 5A:
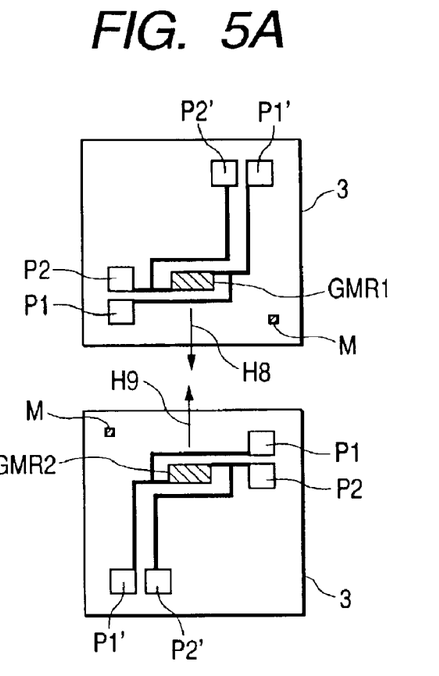
FIG. 5A is a plan view showing a case that a voltage dividing circuit is formed by combining two chips together.

As shown in FIGS. 3 and 5A, each of the magnetoresistive elements GMR1 and GMR2 and connection pads P1, P2, P1' and P2' that are connected to its terminals are formed, as a set, in a chip 3.

A description will be made of how to form a single magnetoresistive element in a single chip in the example of FIGS. 5A and 6B. As shown in FIG. 3, a single magnetoresistive element 1 and two pairs of connection pads P1, P2, P1' and P2' that are connected to terminals E1 and E2 of the magnetoresistive element 1 are formed, as a set, in a single chip 3. Chips 3 each having such a structure are formed on a substrate 2 shown in FIG. 1. In this case, each chip 3 does not have the magnetoresistive element 1 and the connection pads P3, P4, P3', and P4' that are shown in FIG. 1. In forming magnetoresistive elements 1 on the same substrate 2 so as to be arranged in the vertical and horizontal directions, the magnetoresistive elements 1 are cooled in a state that an external magnetic field is applied to the magnetoresistive elements 1 at a temperature that is higher than or equal to a blocking temperature, whereby the fixed layers of the magnetoresistive elements 1 are magnetized in one direction.

As shown in FIG. 3 in an enlarged manner, the connection pads P1 and P2 corresponding to the respective connecting points V1 (or V2) and A of the voltage dividing circuit of FIG. 6B are formed at a predetermined interval along one side 3a of two sides that form a corner of the rectangular chip 3. The connection pads P1' and P2' that correspond to the respective connecting points V1 (or V2) and A of the voltage dividing circuit of FIG. 6B and are paired with the respective connection pads P1 and P2 are formed at a predetermined interval along the other side 3b of the two sides that form the corner of the rectangular chip 3. The connection pads P1 and P2 and the connection pads P1' and P2' that are paired with each other are arranged regularly along the two sides 3a and 3b of the corner of each of the chips 3 as sections of the single substrate 2 and are formed around the magnetoresistive element 1 that is formed in each chip 3.

The terminal E1 of the magnetoresistive element 1 is connected to the connection pads P1 and P1' by wiring patterns and its terminal E2 is connected to the connection pads P2 and P2' by wiring patterns.

In forming a magnetoresistive element 1 in a chip 3, a marking M indicating a magnetization direction of the fixed layer of the magnetoresistive element 1 is formed on the same chip 3. In the example of FIG. 3, the markings M are formed regularly in such a manner that each marking M is located close to the top-left corner of each chip 3 at an intersecting point of a line extended from the connection pad P1 in the horizontal direction and a line extended from the connection pad P1' in the vertical direction.

After completion of the magnetization, the chips 3 each having a set of one magnetoresistive element 1 and four connection pads P1, P2, P1', and P2' are cut out individually from the substrate 2 along the vertical and horizontal chain lines in FIG. 1. FIG. 3 is an enlarged view of each cut-out chip 3.

Then, as shown in FIG. 5A, two cut-out chips 3 are combined together with consideration given to the magnetization directions of the fixed layers of the magnetoresistive elements 1 in the chips 3. In the example of FIG. 5A, the two chips 3 are combined together in such a manner that magnetization directions H8 and H9 of the fixed layers of the magnetoresistive elements 1 are parallel with and opposite to each other (180° is formed). Although FIG. 5A is drawn as if spaces existed between the chips 3, actually the chips 3 are assembled so as to contact each other without forming gaps so that the magnetoresistive elements 1 come adjacent to each other. This assembling method makes it possible to uniformize the magnetic sensitivities of the two magnetoresistive elements 1 to an external magnetic field and to thereby produce a correct output signal.

In this embodiment, although one magnetoresistive element 1 is formed in each chip 3, since the fixed layers of the magnetoresistive elements 1 formed on the substrate 2 are magnetized in the same direction and resulting magnetization is fixed (pinned), no problems occur even if magnetic fields for magnetization that are applied to magnetoresistive elements 1 adjacent to each other influence each other. The strength of the magnetic field for magnetizing the fixed layers of the magnetoresistive elements 1 can be increased to 600 kA/m, for example; the fixed layers of the magnetoresistive elements 1 can be magnetized by such an increased magnetic field for magnetization and resulting magnetization can be fixed. Therefore, the magnetic sensitivities of magnetoresistive elements 1 are increased, whereby the absolute value of their output signal can be increased and correct magnetic field detection is enabled. Further, the output accuracy can be increased.

To clarify a relationship between the magnetoresistive elements shown in FIG. 5A and the magnetoresistive elements of the bridge circuit shown in FIG. 6B, a description will be made by denoting the magnetoresistive elements by symbols GMR1 and GMR2 in FIG. 5A. In this case, the magnetization direction H8 of the fixed layer of the magnetoresistive element GMR1 is set downward and the magnetization direction H9 of the fixed layer of the magnetoresistive element GMR2 is set upward, that is, set parallel with and opposite to the magnetization direction H8 (180° is formed). The voltage dividing circuit of FIG. 5A that is formed by using the two chips 3 each having one magnetoresistive element has the circuit configuration of FIG. 6B.

Also in the case where a single magnetoresistive element is formed in a single chip 3 as shown in FIG. 3, when an external field acts on the free layer of the magnetoresistive element, the magnetization direction of the free layer rotates with respect to that of the fixed layer and the resistance varies accordingly. The resistance variation is minimum when the magnetization direction of the free layer of the magnetoresistive element is the same as that of its fixed layer, and is maximum when the former is parallel with and opposite to the latter (180° is formed).

Figure 5B:
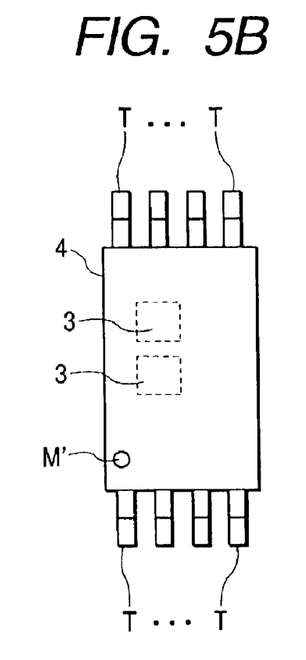
FIG. 5B is a plan view showing a case that the voltage dividing circuit is implemented as an IC circuit.
Figure 5C:
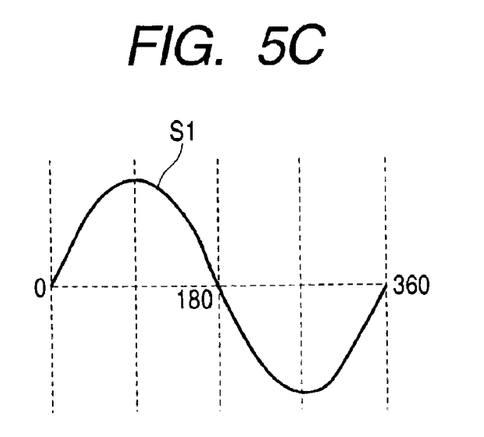
FIG. 5C is a characteristic diagram showing a single-phase output signal.

As shown in FIG. 5B, two chips 3 are mounted on a lead frame (not shown) and common connection pads of the magnetoresistive elements formed on the two chips 3 are connected to eight terminals T of the lead frame. The two chips 3 are hermetically sealed with a sealing resin 4. In this manner, an IC chip 87 is constructed. In this case, it is desirable that a marking M' be provided at a position corresponding to a terminal T as the origin of the magnetoresistive elements in which the magnetization directions of the fixed layers are different from each other so as to form 180°.

Figure 8A:
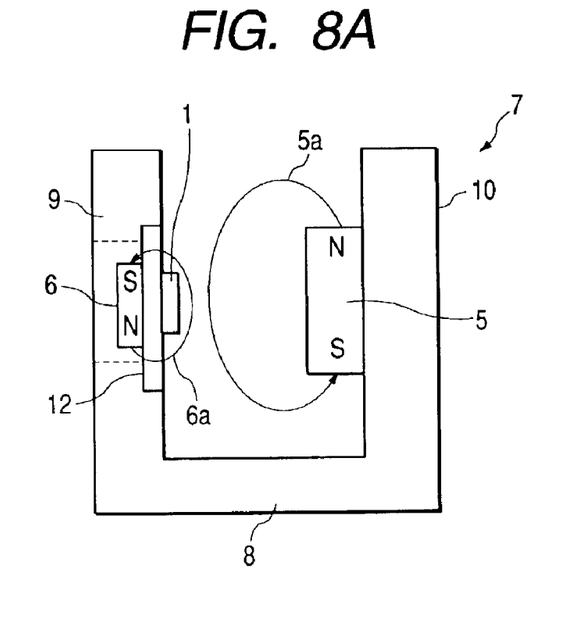
FIGS. 8A and 8B show a magnetic switch that is formed by using a magnetic sensor according to the invention.
Figure 8B:
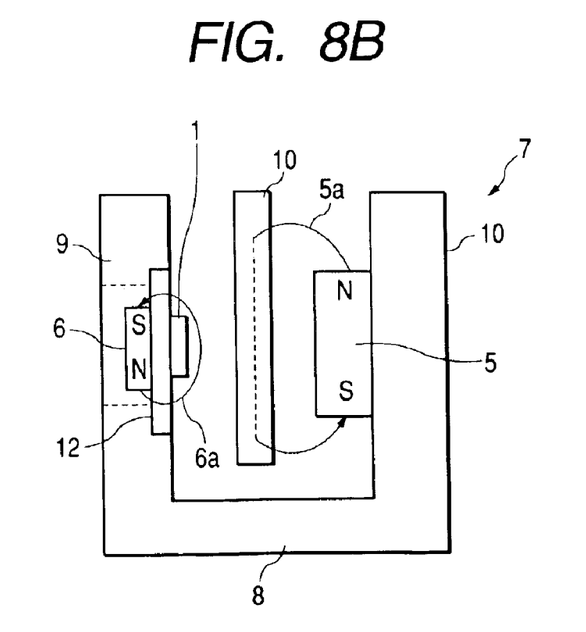

FIGS. 8A and 8B show an example in which a magnetic switch that performs a switch operation (i.e., on/off of contacts) in a non-contact manner is constructed by using a magnetic sensor according to the invention. In this magnetic switch, the magnetic fields of a first magnet 5 and a second magnet 6 that are different from each other in strength and opposite to each other in direction are caused to selectively act, as an external field, on magnetoresistive elements 1 in response to a switching manipulation (on or off) on the switch, whereupon the magnetoresistive elements 1 produce a switching signal for a switch operation. More specifically, as shown in FIG. 8A and 8B, a holder 7 of the magnetic switch has a U shape in which a pair of arms 9 and 10 are provided at both ends of a base 8 so as to be parallel with and opposed to each other. The one arm 9 is provided with the magnetoresistive elements 1 and the second permanent magnet (hereinafter referred to as "second magnet") 6, and the other arm 10 is provided with the first permanent magnet (hereinafter referred to as "first magnet") 5.

In this case, the chip 3 shown in FIG. 3 is used in which a single magnetoresistive element 1 is formed in the single chip 3. Two chips 3 are used, and their two magnetoresistive elements 1 are used as the magnetoresistive element GMR1 and GMR2 of the bridge circuit shown in FIG. 6A and the magnetoresistive elements GMR3 and GMR4 of the bridge circuit shown in FIG. 6A are replaced by fixed resistors. In the two chips 3, the magnetization directions of the fixed layers of the two magnetoresistive elements 1 are set parallel with and opposite to each other (180° is formed) as in the case of the magnetoresistive element GMR1 and GMR2 of the bridge circuit shown in FIG. 6A. The chips 3 are mounted on a board 12 and attached to the inner surface of the arm 9 via the board 12. In FIGS. 8A and 8B, the chips 3 are not shown and the magnetoresistive element GMR1 and GMR2 of the bridge circuit shown in FIG. 6A are drawn as the magnetoresistive element 1.

The second magnet 6 is attached to the arm 9 at a magnetic field acting position where to magnetize the free layers 1*d* (see FIG. 7) of the magnetoresistive elements 1. The magnetic field acting position is set at such a position that magnetic field lines 6*a* of the second magnet 6 act on the free layers 1*d* of the magnetoresistive elements 1 and hence the magnetic field (external field) of the second magnet 6 can magnetize the free layers 1*d* of the magnetoresistive elements 1.

The first magnet 5 is attached to the arm 10 in such a manner that the first magnet 5 is located at such a position (magnetic field acting position) that its magnetic field (external field) can act on and magnetize the free layers 1*d* of the magnetoresistive elements 1, and that magnetic field lines (the direction of the magnetic field) 5*a* of the first magnet 5 are parallel with and opposite in direction to the magnetic field lines (the direction of the magnetic field) 6*a* of the second magnet 6 (180° is formed). The first magnet 5 is a magnet that produces a magnetic field that is stronger by hundreds of gausses than that produced by the second magnet 6.

The magnetic switch further has a magnetic shield member 11 made of a ferromagnetic material whose relative position with respect to the first magnet 5 and the second magnet 6 is changed. The magnetic shield member 11 is moved between a first position with which both of the magnetic fields of the first magnet 5 and the second magnet 6 are allowed to act on the magnetoresistive elements 1 to magnetize their free layers 1*d* in a first direction and a second position with which one of the magnetic fields of the first magnet 5 and the second magnet 6 is allowed to act on the magnetoresistive elements 1 to magnetize their free layers 1*d* in a second direction that is opposite to the first direction. As shown in FIG. 8A, the first position is a position to which the magnetic shield member 11 retreats from between the first magnet 5 and the magnetoresistive elements 1. On the other hand, as shown in FIG. 8B, the second position is a position where the magnetic shield member 11 resides when having entered the space between the first magnet 5 and the magnetoresistive elements 1.

When the magnetic shield member 11 has been moved to the second position by a driving means (not shown), as shown in FIG. 8B, the magnetic shield member 11 makes the magnetic field lines 5*a* of the first magnet 5 go away from the free layers 1*d* of the magnetoresistive elements 1 to shield those from the magnetic field of the first magnet 5 and allows only the magnetic field of the second magnet 6 to act as an external magnetic field on the magnetoresistive elements 1. Therefore, only the magnetic field of the second magnet 6 that is weaker than that of the first magnet 5 acts, as an external magnetic field, on the free layers 1*d* of the magnetoresistive elements 1.

On the other hand, when the magnetic shield member 11 has been moved to the first position as shown in FIG. 8A, both of the magnetic fields of the first magnet 5 and the second magnet 6 act on the magnetoresistive elements 1 as external magnetic fields. The magnetic field of the first magnet 5 is stronger than that of the second magnet 6 and the first magnet 5 and the second magnet 6 have the functions of magnetizing the free layers id of the magnetoresistive elements 1 in opposite directions (180° is formed). Therefore, the magnetic field of the second magnet 6 is canceled out by that of the first magnet 5 and the magnetic field of the first magnet 5 dominantly acts on the free layers 1*d* of the magnetoresistive elements 1, whereby the magnetization direction of the free layers 1*d* of the magnetoresistive elements 1 is reversed so as to become opposite to the direction of magnetization that has been caused by the second magnet 6 (180° is formed).

The resistances of the magnetoresistive elements 1 vary as the magnetization direction of the free layers 1*d* of the magnetoresistive elements 1 is reversed depending on which of the magnetic fields of the first magnet 5 and the second magnet 6 acts (dominantly). Further, since the first magnet 5 and the second magnet 6 magnetize the free layers 1*d* of the magnetoresistive elements 1 in opposite directions (180° is formed), resistance variations occur instantaneously.

In the case of switch off, the magnetic shield member 11 retreats from between the first magnet 5 and the magnetoresistive elements 1 as shown in FIG. 8A and hence the magnetic field of the first magnet 5 acts on the magnetoresistive elements 1 dominantly. In this case, the direction of the magnetic field lines 5*a* of the first magnet 5 is the same as the magnetization direction of the fixed layer 1*b* of one of the magnetoresistive elements 1. And the resistance of the other magnetoresistive element 1 whose fixed layer 1*b* is magnetized in the opposite direction to the direction of the magnetic field lines 5*a* of the first magnet 5 (180° is formed) varies to a large extent.

In the case of switch on, the magnetic shield member 11 enters the space between the first magnet 5 and the magnetoresistive elements 1 as shown in FIG. 8B, and hence the magnetoresistive elements 1 are shielded from the magnetic field of the first magnet 5 and only the magnetic field of the second magnet 6 acts on the magnetoresistive elements 1. In this case, the resistance of the magnetoresistive element 1 whose fixed layer 1*b* is magnetized in the opposite direction to the direction of the magnetic field lines 6a of the second magnet 6 varies to a large extent.

The bridge circuit outputs a signal reflecting resistance variations of the magnetoresistive elements 1, based on which a switching signal for a switch operation is output.

In this above magnetic switch, the magnetic fields of the first magnet 5 and the second magnet 6 that are different from each other in strength and opposite to each other in direction are caused to selectively act, as an external field, on the magnetoresistive elements 1 in response to a switching manipulation on the switch, whereupon the magnetoresistive elements 1 produce a switching signal for a switch operation. The switch is switched based on the switching signal. By moving the magnetic shield member 11, the direction of the magnetic field to act on the magnetoresistive elements 1

(i.e., the direction in which to magnetize the free layers 1*d* of the magnetoresistive elements 1) can be changed between opposite directions (180° is formed). Therefore, even with the configuration in which the strength of the magnetic field varies slowly, the resistances of the magnetoresistive elements 1 can be changed rapidly. A switch operation can be performed quickly based on such rapid resistance variations.

Although the above description is directed to the case that the magnetic switch is formed by using the magnetic sensor, the invention is not limited to such a case. An object detection sensor can be constructed that uses magnetoresistive elements having respective free layers whose magnetization directions are varied by an external magnetic field, and that detects a member to be detected having a magnetic shield function. In this embodiment, the magnetic fields of a first magnet and a second magnet that are different from each other in strength and opposite to each other in direction are caused to selectively act, as an external field, on magnetoresistive elements in accordance with a movement of the member to be detected, whereby the magnetoresistive elements can produce a detection signal indicating detection of the member to be detected.

This object detection sensor is different from the magnetic switch of FIGS. 8A and 8B in that the magnetic shield member 11 of the magnetic switch is used as the member to be detected having the magnetic shield function and that the member (11) to be detected is detected. The configuration of the object detection sensor is the same as the magnetic switch of FIGS. 8A and 8B in the other points.

The member (11) to be detected moves in such a manner that its relative position with respect to the first magnet 5 and the second magnet 6 varies. As the relative position of the member (11) to be detected varies with respect to the first magnet 5 and the second magnet 6, there occur a first state in which both of the magnetic fields (external magnetic fields) of the first magnet 5 and the second magnet 6 act on the magnetoresistive elements 1 and a second state in which only one of the magnetic fields (external magnetic fields) of the first magnet 5 and the second magnet 6 acts on the magnetoresistive elements 1, whereby the member (11) to be detected is detected.

A state that the member (11) to be detected has retreated from between the first magnet 5 and the magnetoresistive elements 1 (see FIG. 8A) is employed as the first state. On the other hand, a state that the member (11) to be detected has entered the space between the first magnet 5 and the magnetoresistive elements 1 (see FIG. 8B). In the second state, the member (11) to be detected shields the magnetoresistive elements 1 from the magnetic field of the first magnet 5 that is stronger than that of the second magnet 6 and hence only the magnetic field of the second magnet 6 acts on the magnetoresistive elements 1 as an external field.

In this object detection sensor, the magnetic fields of the first magnet 5 and the second magnet 6 that are different from each other in strength and opposite to each other in direction are caused to selectively act, as an external field, on the magnetoresistive elements 1 in accordance with a movement of the member (11) to be detected. The magnetoresistive elements 1 output a detection signal indicating detection of the member (11) to be detected, based on which the member (11) to be detected is detected. As the member (11) to be detected moves, the direction of the magnetic field to act on the magnetoresistive elements 1 (i.e., the direction in which to magnetize the free layers of the magnetoresistive elements 1) can be changed between opposite directions (180° is formed).

Figure 11A:
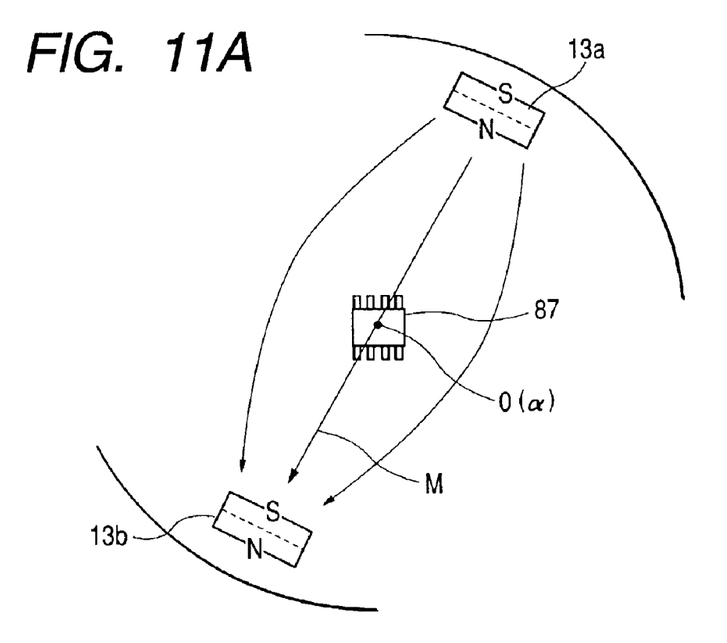
FIG. 11A shows the main part of another variable resistor according to the invention.
Figure 11B:
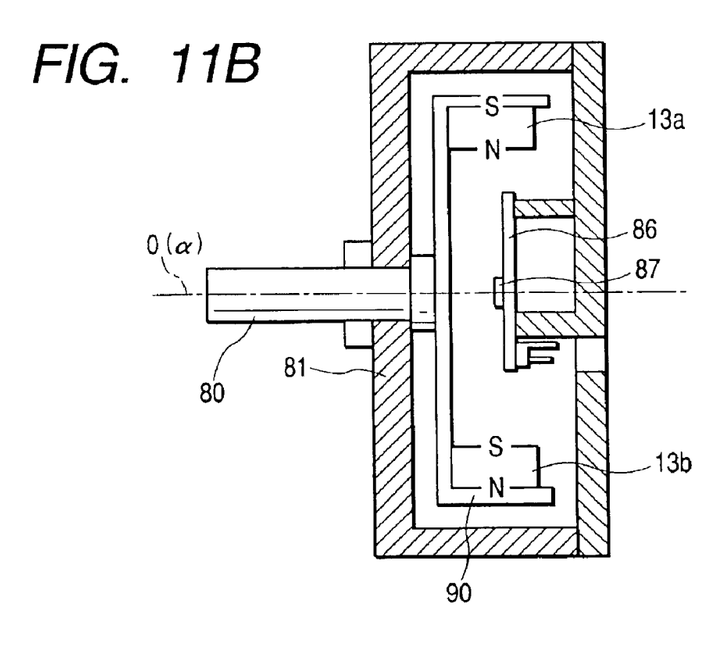
FIG. 11B is a sectional view of the variable resistor of FIG. 11A.

FIGS. 11A and 11B show an example in which a variable resistor is formed by using the above-described magnetic sensor. This variable resistor has a rotary shaft 80, a bearing member 81 that supports the rotary shaft 80 in such a manner that the rotary shaft 80 can rotate about its axis, a cover member 82 that is attached to the back surface of the bearing member 81, a shield plate 90 and magnetic coding members 13*a* and 13*b* that are provided on the back side of the bearing member 81 so as to be integral with the rotary shaft 80, and an attachment board 86 that is mounted with circuit parts such as the IC chip 87 shown in FIG. 4B and a connector for outputting signals to the outside and that is attached to the cover member 82.

The rotary shaft 80 has a rod-like shape and is made of a non-magnetic material such as a resin or a non-magnetic stainless steel. One end portion of the rotary shaft 80 penetrates through the bearing member 81 and projects to its back side, and the dish-shaped shield plate 90 that is a steel plate, for example, capable of shielding from a magnetic field is attached to the one end portion of the rotary shaft 80 in an integral manner. The two magnetic coding members 13*a* and 13*b* each of which is a two-pole (N and S poles) permanent magnet are attached to the inner surface of the shield plate 90 at such positions as to be opposed to each other with the rotation axis O interposed in between. The magnetic coding members 13*a* and 13*b* apply, to the giant magnetoresistive elements, magnetic fields that are strong enough to saturate them.

The IC chip 87 is attached to the attachment board 86 so as to be located on a line that connects the centers of the respective magnetic coding members 13*a* and 13*b* in their axial directions, and is positioned in such a manner that the rotation center O of the rotary shaft 80 coincides with the center of the four chips that is denoted by symbol α in FIG. 11A. The IC chip 87 is sufficiently smaller than the magnets. As shown in FIG. 11, a parallel magnetic field M extending in one direction acts on the IC chip 87. The magnetization direction rotates so as to follow the direction of the magnetic field M as the rotary shaft 80 rotates. Operating in the same manner as described above, the variable resistor produces sinusoidal signals that deviate from each other by 90° in phase as shown in FIG. 4D.

In the variable resistor of FIGS. 9 and 10, somewhat curved part of the magnetic field lines that originate from the magnetic coding member 83 act on the IC chip 87. In contrast, in the embodiment of FIGS. 11A and 11B, a parallel magnetic field that is closer to a straight line acts on the giant magnetoresistive elements in the IC chip 87 because the magnetic coding members 13*a* and 13*b* are opposed to each other, the IC chip 87 is disposed in the plane of the magnetic coding members 13*a* and 13*b*, and the giant magnetoresistive elements are located in a range that is narrower than the length of the magnets. This makes it possible to produce output signals that are closer to sinusoidal waves.

The examples in which the magnetic sensor according to the invention is applied to the magnetic switch, the object detection sensor, and the variable resistors have been described above with reference to FIGS. 8A and 8B, FIGS. 9 and 10, and FIGS. 11A and 11B. However, the application range of the magnetic sensor according to the invention is not limited to the devices shown in these drawings.

As described above, the invention makes it possible to magnetize the fixed layers of respective magnetoresistive elements by a sufficiently strong magnetic field for magnetization and to thereby allow the magnetoresistive elements to produce an output signal having a large absolute value.

What is claimed is:

1. An assembling method of a magnetic sensor, characterized by comprising the steps of:

forming a plurality of magnetoresistive elements on the same substrate in such a manner that the magnetoresistive elements are arranged regularly;

forming a plurality of connection pads at regular positions on the same substrate in such a manner that the connection pads are connected to terminals of the magnetoresistive elements;

magnetizing, in the same magnetization direction, fixed layers of all the magnetoresistive elements that are formed on the same substrate;

cutting out a plurality of chips each having a set of magnetoresistive elements and connection pads from the substrate; and combining a plurality of cut-out chips together with consideration given to the magnetization directions of the fixed layers of the magnetoresistive elements in the chips, wherein chips are cut out in such a manner that each chip includes at least two magnetoresistive elements and two sets of connection pads, wherein four chips are used in each of which at least two magnetoresistive elements are formed; and wherein bridge circuits that produce a multiple-phase output signal are formed by combining the four chips together in such a manner that the magnetization directions of the fixed layers of the magnetoresistive elements belonging to chips adjacent to each other deviate from each other by 90° in order in the same rotational direction and connecting, in series, magnetoresistive elements whose fixed layers are magnetized in opposite directions.

2. The assembling method of a magnetic sensor according to claim 1, characterized in that connection pads are formed at symmetrical positions with respect to two sides that form a corner of each chip.

* * * * *